(12) United States Patent
Chuang et al.

(10) Patent No.: US 8,853,753 B2
(45) Date of Patent: Oct. 7, 2014

(54) CONTACT FOR HIGH-K METAL GATE DEVICE

(71) Applicant: Taiwan Semiconductor Manufacturing Company, Ltd., Hsin-Chu (TW)

(72) Inventors: Harry-Hak-Lay Chuang, Singapore (SG); Sheng-Chen Chung, Jhubei (TW); Wei Cheng Wu, Zhubei (TW); Bao-Ru Young, Zhubei (TW); Huan-Just Lin, Hsinchu (TW); Tsai-Chun Li, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/971,267

(22) Filed: Aug. 20, 2013

(65) Prior Publication Data

US 2013/0328115 A1    Dec. 12, 2013

Related U.S. Application Data

(62) Division of application No. 13/289,112, filed on Nov. 4, 2011, now Pat. No. 8,546,227.

(60) Provisional application No. 61/535,140, filed on Sep. 15, 2011.

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)
*H01L 29/78* (2006.01)
*H01L 21/8238* (2006.01)
*H01L 29/417* (2006.01)
*H01L 29/423* (2006.01)
*H01L 29/49* (2006.01)
*H01L 29/66* (2006.01)
*H01L 21/768* (2006.01)

(52) U.S. Cl.
CPC ........ *H01L 29/78* (2013.01); *H01L 21/823842* (2013.01); *H01L 29/41775* (2013.01); *H01L 29/42376* (2013.01); *H01L 29/4966* (2013.01); *H01L 29/665* (2013.01); *H01L 29/6653* (2013.01); *H01L 29/66545* (2013.01); *H01L 29/6656* (2013.01); *H01L 29/6659* (2013.01); *H01L 29/7833* (2013.01); *H01L 21/76805* (2013.01); *H01L 21/76816* (2013.01)
USPC ............. 257/288; 257/E21.409; 257/E29.255

(58) Field of Classification Search
CPC ....................................... H01L 29/78
USPC ............................ 257/288, E21.409, E29.255
See application file for complete search history.

(56) References Cited

U.S. PATENT DOCUMENTS

2012/0187459 A1    7/2012  Pan et al.

*Primary Examiner* — David S Blum
(74) *Attorney, Agent, or Firm* — Haynes and Boone, LLP

(57) ABSTRACT

An integrated circuit includes a semiconductor substrate including a source region and a drain region and a gate dielectric over the semiconductor substrate. A metal gate structure is over the semiconductor substrate and the gate dielectric and between the source and drain regions. The integrated circuit further includes an interlayer dielectric (ILD) over the semiconductor substrate. First and second contacts extend through the ILD and adjacent the source and drain regions, respectively, and a third contact extends through the ILD and adjacent a top surface of the metal gate structure. The third contact further extends into an undercut region of the metal gate structure.

17 Claims, 10 Drawing Sheets

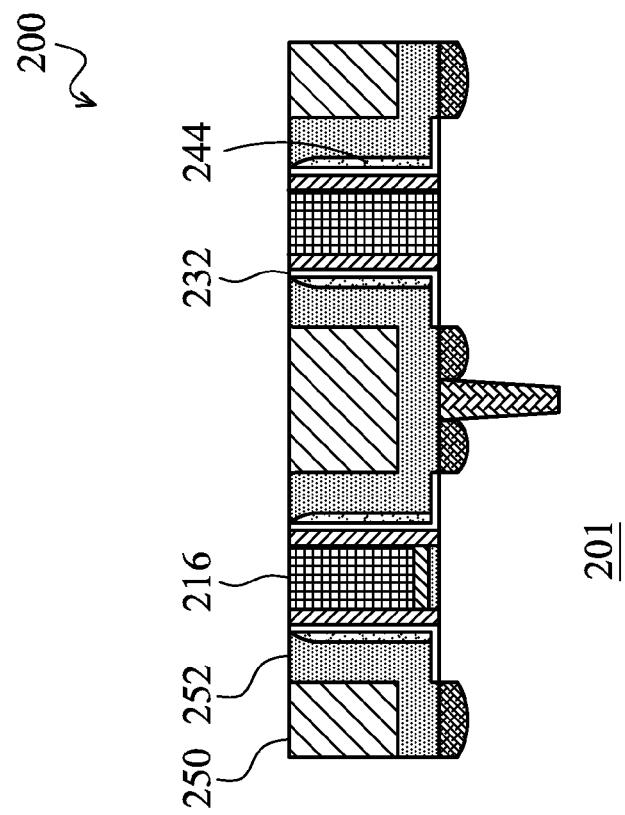
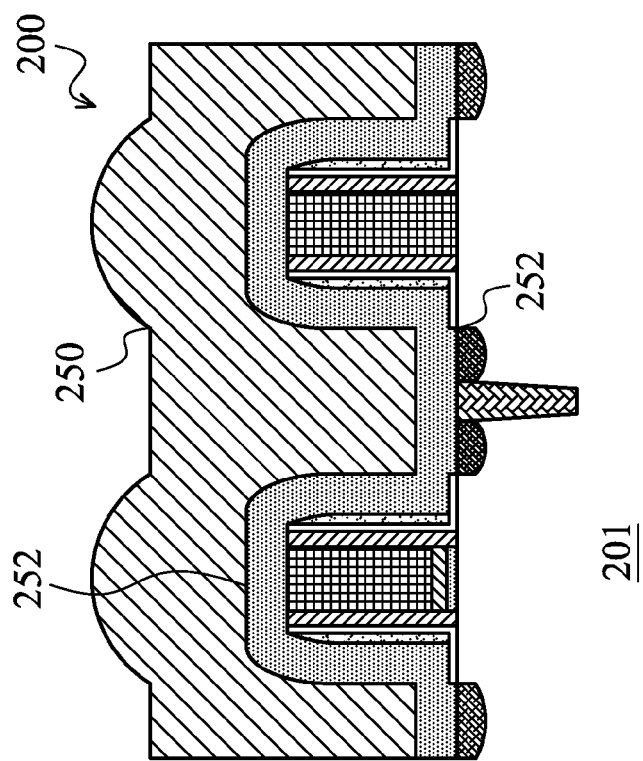

CONTACT FOR HIGH-K METAL GATE DEVICE

This patent is a divisional of U.S. Ser. No. 13/289,112 filed Nov. 4, 2011, and also claims the benefit of U.S. Ser. No. 61/535,140, now U.S. Pat. No. 8,546,227, filed Sept. 15, 2011, the disclosures of which are hereby incorporated by reference.

BACKGROUND

There are several continuing areas of development and improvement for semiconductor device fabrication. One such area is device size. The size, including width, of a gate structure in metal-oxide-semiconductor field-effect transistor (MOSFET) devices continues to shrink, providing benefits such as increased density and reduced power. Another area is the use of MOSFET devices having a high dielectric constant (high-k) material and a metal gate. The present disclosure provides improvements that relate to the fabrication of such devices.

SUMMARY

The present disclosure provides many different embodiments of methods for making integrated circuit devices. In one embodiment, a method of making an integrated circuit includes providing a substrate and forming a metal structure over the substrate. A dielectric is formed over the metal structure and a first etch process creates a trench in the dielectric over the metal structure. A second, isotropic etch process forms an undercut in the metal structure, the undercut being proximate to the trench. The trench and undercut are filled with a conductive material, such as tungsten, to contact the metal structure.

In another embodiment, a method for making an integrated circuit includes providing a substrate with a high-k dielectric and providing a polysilicon gate structure over the high-k dielectric. A doping process is performed on the substrate adjacent to the polysilicon gate structure, after which the polysilicon gate structure is removed and replaced with a metal gate structure. An interlayer dielectric (ILD) is deposited over the metal gate structure and the doped substrate, and a dry etch process forms a trench in the ILD to a top surface of the metal gate structure. After the dry etch process, a wet etch process forms an undercut near the top surface of the metal gate structure. The trench and undercut are then filled with a metal material.

The present disclosure also provides an integrated circuit. In one embodiment, the integrated circuit includes a semiconductor substrate having source and drain regions. A gate dielectric is provided over the semiconductor substrate, and a metal gate structure is provided over the semiconductor substrate and the gate dielectric and between the source and drain regions. An interlayer dielectric (ILD) is provided over the semiconductor substrate. The integrated circuit further includes first and second contacts extending through the ILD and adjacent the source and drain regions, respectively; and a third contact extending through the ILD and adjacent a top surface of the metal gate structure. The third contact extends into an undercut region of the metal gate structure.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Also, several elements and features are shown in the figures, not all of which are numbered for the sake of clarity. It is understood, however, that symmetrical features and items will be similarly situated.

FIGS. 2-19 are sectional views of one embodiment of a semiconductor device having an n-type and p-type MOSFET (an NFET and PFET) with metal gate stacks, at various fabrication stages constructed according to the method of FIG. 1.

DETAILED DESCRIPTION

Figure 1:
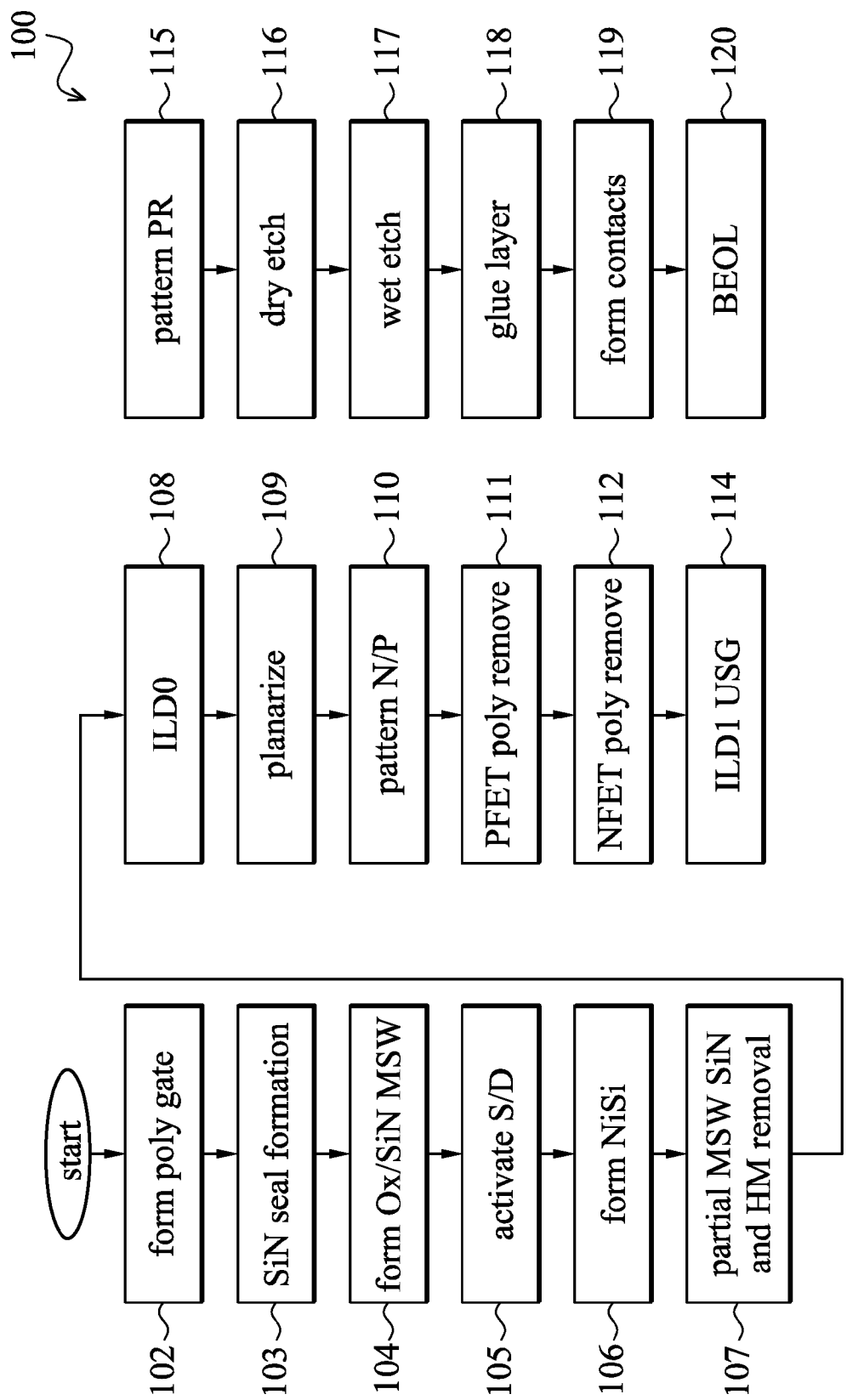
FIG. 1 is a flowchart of a method of making the semiconductor device having a metal gate stack according to one embodiment of the present invention.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of a method 100 for making a semiconductor device according to one embodiment. The semiconductor device includes an n-type field-effect transistor (NFET) and a p-type field-effect transistor (PFET), both with a metal gate stack resistor constructed according to various aspects of the present disclosure. FIGS. 2 through 19 are sectional views of a semiconductor structure 200 at various fabrication stages and constructed according to one or more embodiments. The semiconductor structure 200 and the method 100 of making the same are collectively described with reference to FIGS. 1 through 19.

Figure 2:
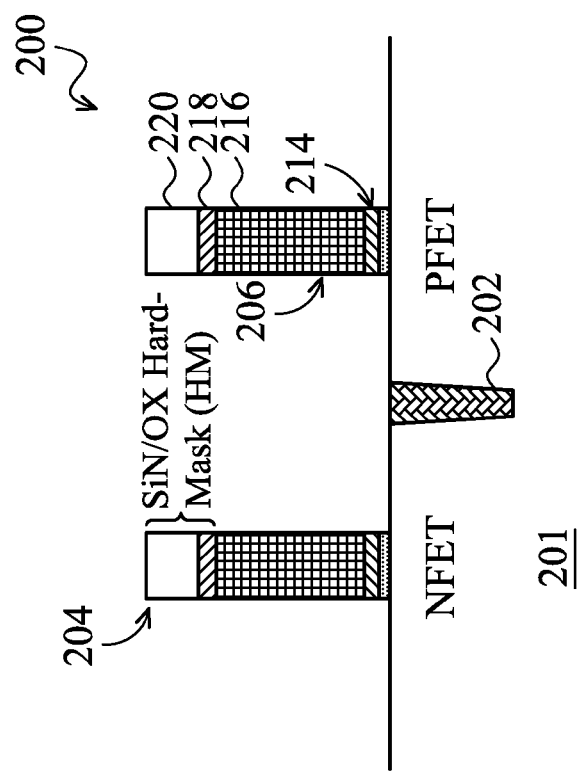

Referring to FIGS. 1 and 2, the method 100 begins at step 102 by providing a semiconductor substrate 201 on which to form a polysilicon gate. The semiconductor substrate 201 includes silicon. Alternatively, the substrate includes germanium, silicon germanium or other proper semiconductor materials. The semiconductor substrate also includes various doped regions such as n-well and p-wells. The semiconductor substrate 201 includes an isolation feature such as shallow trench isolation (STI) 202 formed in the substrate to separate NFET and PFET transistors. The formation of the STI feature includes etching a trench in a substrate and filling the trench by one or more insulator materials such as silicon oxide, silicon nitride, or silicon oxynitride. The filled trench may have a multi-layer structure such as a thermal oxide liner layer with silicon nitride filling the trench. In one embodiment, the STI feature 202 is created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure. The semiconductor substrate 201 also includes various n-wells and p-wells formed in various active regions.

Two similar polysilicon gate stacks 204, 206 are formed on the substrate 201, on either side of the STI structure 202. In the present embodiment, each polysilicon gate stack 204, 206 includes (viewed in the figure from the substrate 201 up), a silicon oxide interfacial layer (IL), a high-k dielectric layer (HK) and a cap layer, generally designated with the reference number 214. In various embodiments, the interfacial layer may be formed by chemical oxide technique, thermal oxide procedure, atomic layer deposition (ALD) or chemical vapor deposition (CVD). The high k dielectric material layer may be formed by CVD, ALD, plasma enhanced CVD (PECVD), or plasma enhanced ALD (PEALD). The cap layer can be formed using CVD with precursor silane ($SiH_4$) or other silicon based precursor.

Continuing with the present embodiment, a polycrystalline silicon (polysilicon) layer 216 is formed above the IL/HK/Cap layer 214. In the present embodiment, the polysilicon layer 216 is non-doped. The silicon layer 216 alternatively or additionally may include amorphous silicon. An oxide 218 is formed over the polysilicon layer 216, and a silicon nitride layer (SiN) 218 is formed over it, forming a hard mask (HM). It is understood that the formation, including patterning, of such layers is well known in the art, and will not be further discussed for the sake of brevity and clarity.

Figure 3:
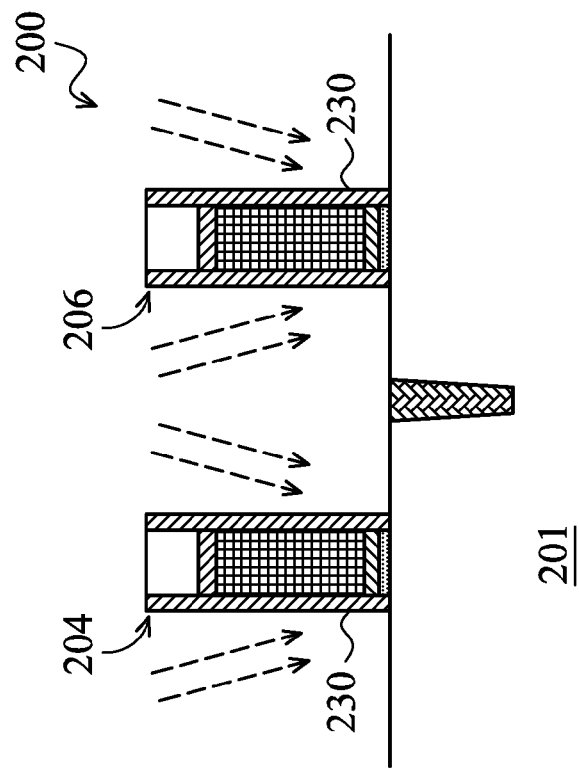

Referring to FIGS. 1 and 3, the method 100 proceeds to step 103, where a SiN seal 230 is formed around the gate stacks 204, 206. In the present embodiment, the SiN seal 230 is formed using atomic layer deposition to form a layer of approximately 50 A thickness. In addition, the substrate 201 is doped to form halogen and light doped drain (LDD) regions for the source and drain (S/D) features. The source and drain regions are formed for the NFET and the PFET devices using proper doping species.

Figure 4:
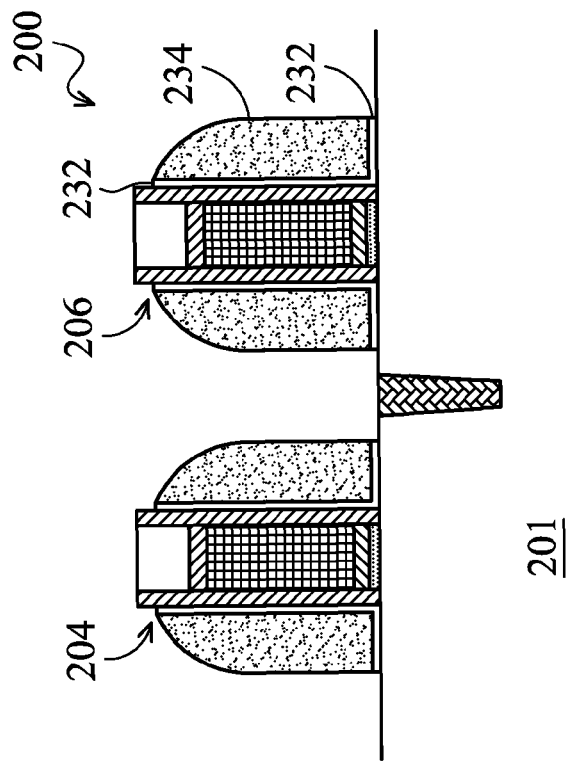

Referring to FIGS. 1 and 4, the method 100 proceeds to step 104, where a main side wall (MSW) is formed. The MSW includes an oxide (OX) layer 232 adjacent to the outer surface of the SiN layer 230 and the upper surface of the substrate 201. In the present embodiment, the OX layer 232 is formed by ALD to a thickness of about 30 A. The MSW also includes SiN sidewalls 234 formed on an outer surface of the OX layer 232. The SiN layer is formed to a maximum thickness of about 250 A. As shown in FIG. 4, the MSW is adjacent to the sidewalls of the polysilicon gate stacks 204, 206, and do not cover the entire substrate.

Figure 5:
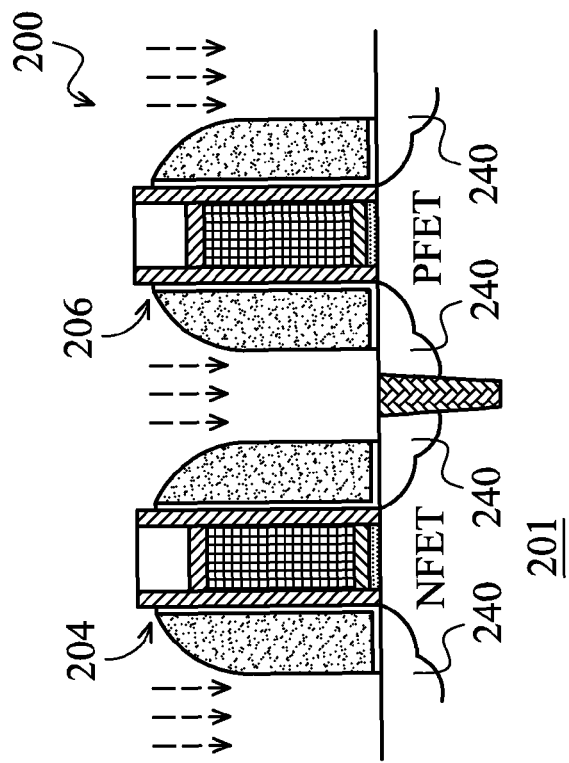

Referring to FIGS. 1 and 5, the method 100 proceeds to step 105, where S/D and electrostatic discharge regions 240 are fully implanted and activated. As mentioned above with respect to step 103, LDD regions were previously provided in the substrate 201 prior to the MSW being formed at step 104. At step 105, a deeper implantation process is performed. The doped regions for the NFET are doped with P-type dopants, such as boron or BF2, and the doped regions for the PFET are doped with N-type dopants, such as phosphorus or arsenic. The doped regions 240 may be formed directly on the substrate 201, in a P-well structure, in an N-well structure, in a dual-well structure, or using a raised structure. In the present embodiment, the S/D activation is performed by a laser anneal (LSA) at about 1150 C, along with a rapid thermal anneal (RTA) with about a 1010 C spike.

Figure 6:
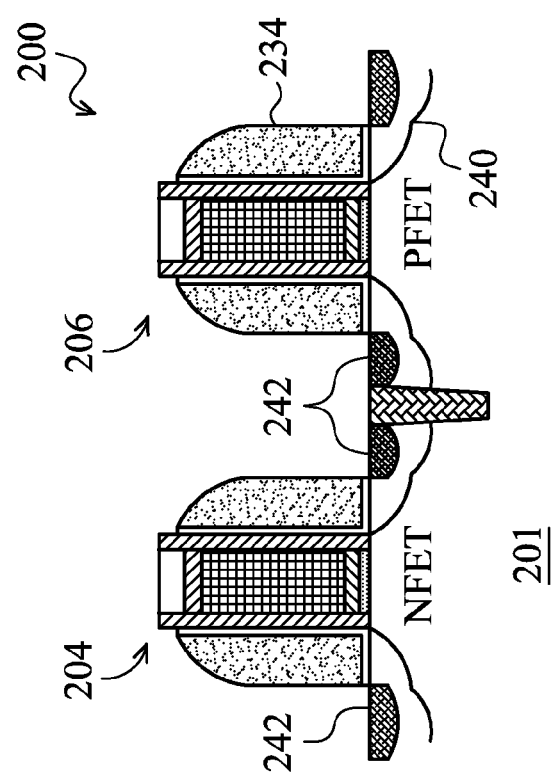

Referring to FIGS. 1 and 6, the method 100 proceeds to step 106, in which nickel silicide (NiSi) regions 242 are formed for future contacts to the S/D regions 240. In the present embodiment, Ni is deposited to a thickness of about 400A in the substrate 201, guided by the MSW formed at step 105.

Figure 7:
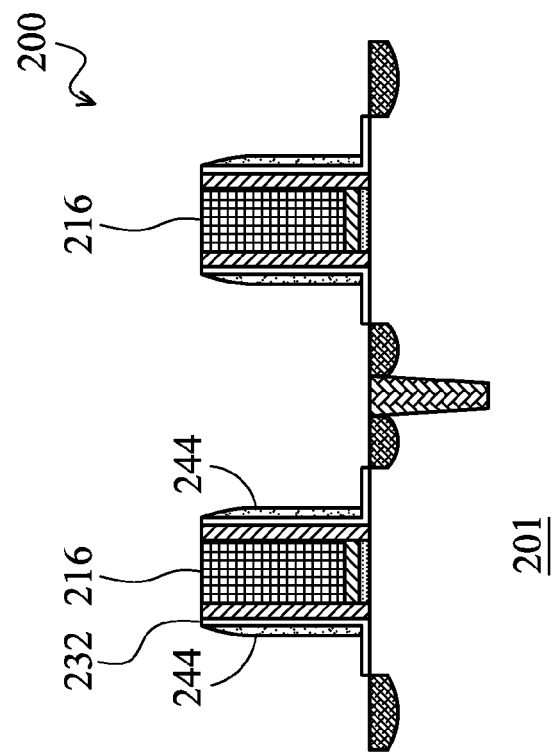

Referring to FIGS. 1 and 7, the method 100 proceeds to step 107, in which a portion of the SiN layer 234 of the MSWs is removed from the two gate stacks. As shown in FIG. 7, a portion of the SiN layer, now labeled 244, remains on the MSWs, as well as the OX layer 232. In the present embodiment, this removal process is performed by a wet etch using $H_3PO_4$ at about 120 C. In addition, the HM 218, 220 is removed from the top portion of the polysilicon gate 216. In the present embodiment, the SiN and OX HM is removed by a dry etch process.

Referring to FIGS. 1 and 8, the method 100 proceeds to step 108, in which an interlayer dielectric (ILD) layer 250 is formed over the two gate stacks 204, 206. In the present embodiment, a tensile SiN contact etch stop layer 252 is deposited first, to a thickness of about 200 A. Thereafter, the ILD layer 250, phosphate silicate glass (PSG) in the present embodiment, is deposited to a thickness of about 2000 A using and ion plasma (IPM).

Referring to FIGS. 1 and 9, the method 100 proceeds to step 109, in which the upper surface of the device is planarized to expose the polysilicon gates 216. In the present embodiment, a chemical mechanical polishing process is performed.

Figure 10:
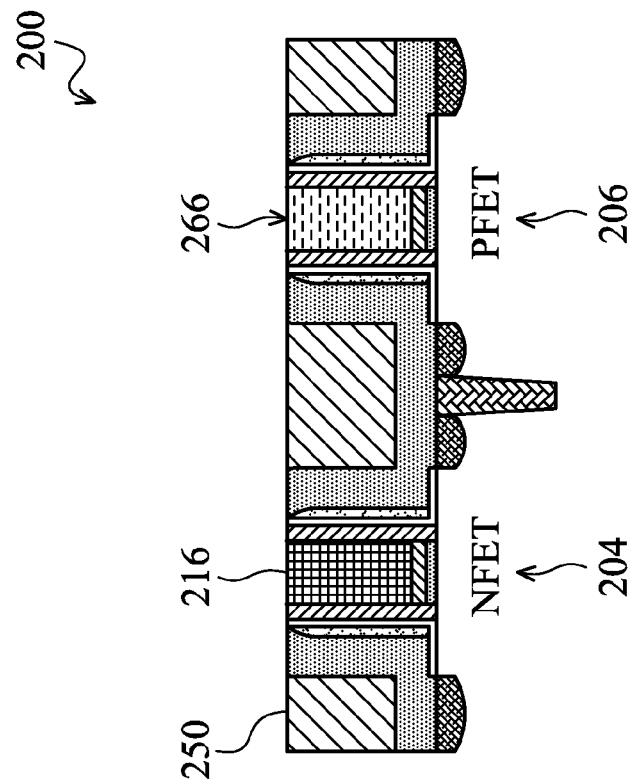

Referring to FIGS. 1 and 10, the method 100 proceeds to step 110, in which one of the two polysilicon gate stacks 204, 206 is masked. In the present embodiment, the polysilicon mask 216 for the NFET gate stack 204 is masked with a patterned photoresist (PR) layer 260. Specifically, a 20 A TiN hard mask 262 is deposited over a top surface of the device, and then the PR layer 260 is deposited over it. The PR layer 260 is patterned to mask the NFET gate stack 204.

Figure 11:
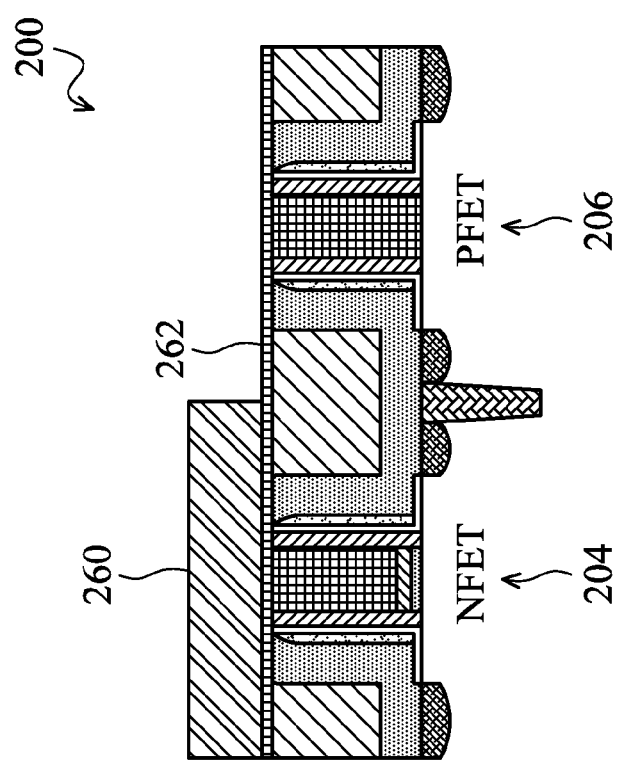

Referring to FIGS. 1 and 11, the method 100 proceeds to step 111, the polysilicon 216 in the PFET gate stack 206 is removed. In the present embodiment, the polysilicon 216 is removed via etching from the PFET gate stack 206 (which is now more accurately described as a trench than a gate stack), while the polysilicon in the NFET gate stack remains intact for being shielded by the patterned PR 260 in FIG. 10. Afterwards, a metal gate 266 is formed in the trench remaining from the removed polysilicon 216 in the PFET gate stack 206. The metal gate can be formed of one or more layers, and in the present embodiment, include the following deposited metals in order: TaN, TiN, TaN, TiN and Al (with trace amounts of Cu). The deposited metal layers cover the entire surface of the device 200, but are then removed, including the PR 260, by a CMP process.

Figure 13:
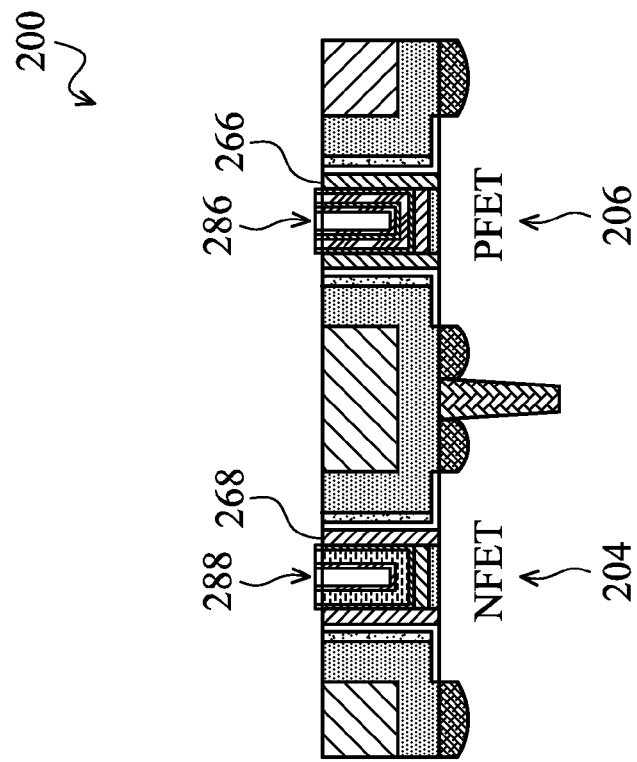
Figure 12:
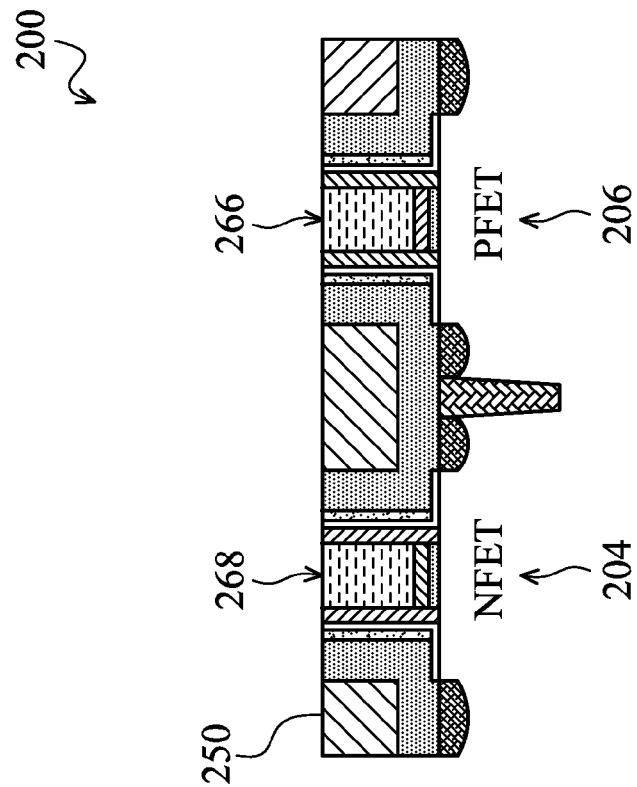

Referring to FIGS. 1, 12, and 13, the method 100 proceeds to step 112, in which a similar process is repeated on the NFET gate stack 204. In the present embodiment, since the polysilicon has already been removed and replaced on the PFET gate stack 206, a patterned PR layer covering the PFET gate stack is not used. The polysilicon 216 is removed from the NFET gate stack 204, such as by an etch process. Afterwards, a metal gate 268 is formed in the trench remaining from the removed polysilicon 216 in the NFET gate stack 204. The metal gate 268 can be formed of one or more layers, and in the present embodiment, include the following deposited metals in order: TaN, TiAl, TiN and Al (with trace amounts of Cu). The deposited metal layers cover the entire surface of the device 200, but are then removed, including the PR 260, by a CMP process. As a result, both of the polysilicon gate stacks are now metal gate stacks 204, 206.

In the present embodiment, a film is formed over the metal gate stacks 204, 206. With specific reference to FIG. 13, in one embodiment, an ultra-thin metal oxynitride film, with a thickness of about 1 nm to about 10 nm is formed over the two gate stacks 266, 268, as disclosed in U.S. Ser. No. 61/530,845, which is hereby incorporated by reference. In other embodiments, the film operates as an etch stop layer for a subsequent etch process, discussed below with reference to FIG. 16.

Figure 14:
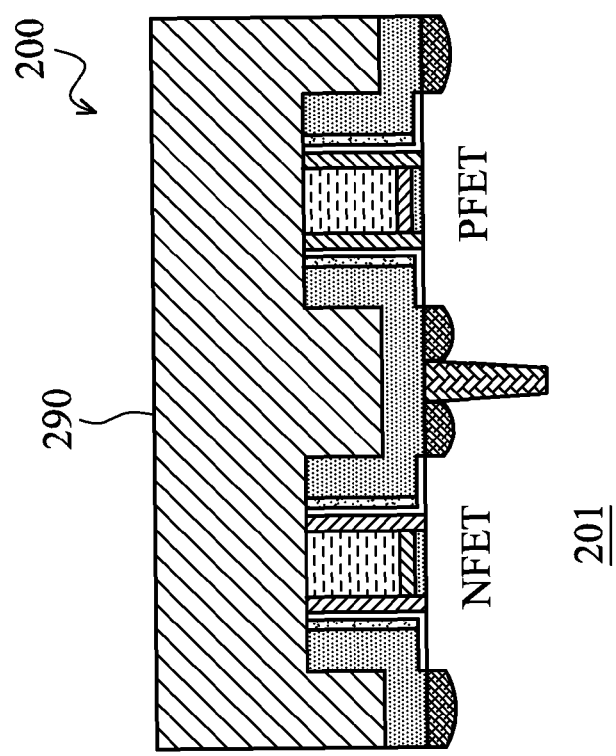

Referring to FIGS. 1 and 14, the method 100 proceeds to step 114, in which an ILD 290 is formed over the metal gate stacks 204. 206, including the ultra-thin metal oxynitride films 288, 286. In the present embodiment, the ILD 290 is undoped silicate glass (USG) at a thickness of about 1450 A. The USG 290 is formed by a deposition process at 400 C using SiH4/N2O/He. The USG 290 can be formed on top of the PSG 250, or the PSG 250 can be removed, and/or a additional combinations of dielectric materials can be formed.

Figure 15:
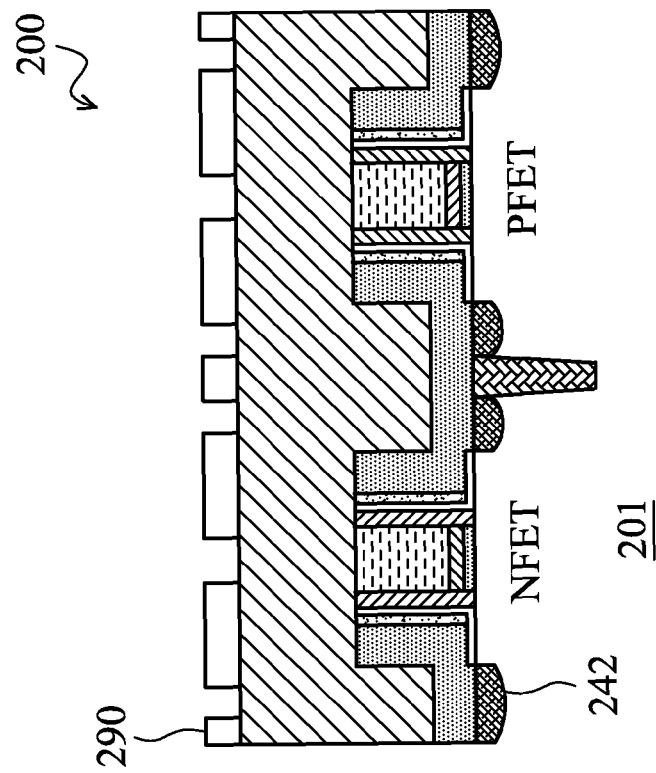

Referring to FIGS. 1 and 15, the method 100 proceeds to step 115, where a layer of photoresist (PR) 292 is applied to the top surface of the USG 290. The PR 292 is patterned, such as by a photolithography or e-beam process, to form openings that correspond with trenches and contacts to be discussed further below.

Figure 16:
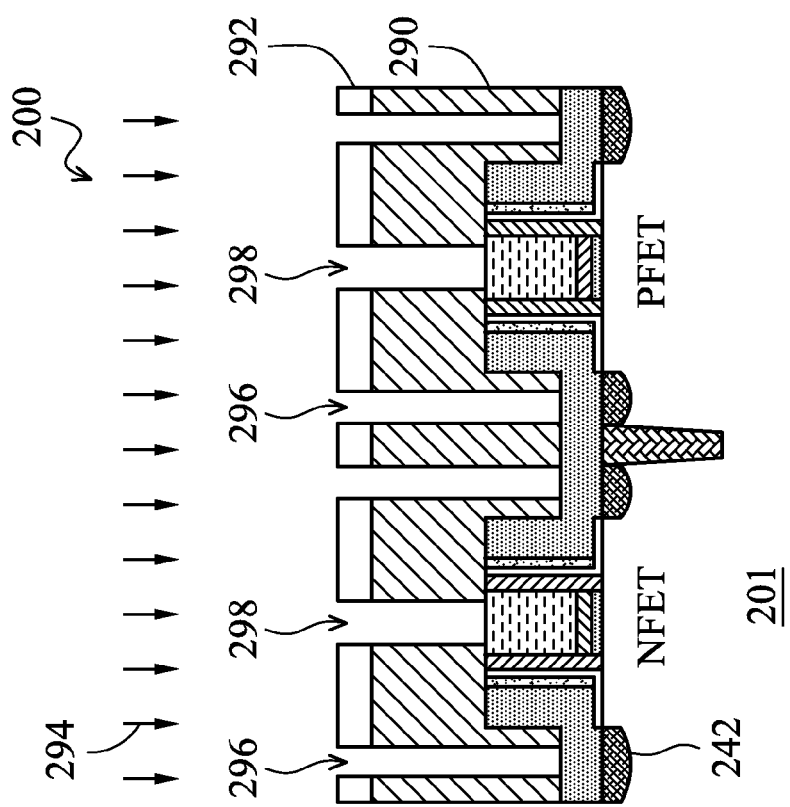

Referring to FIGS. 1 and 16, the method 100 proceeds to step 116 in which a first etch 294 is performed on the USG 290 according to the patterned PR 292. In the present embodiment, a dry, anisotropic plasma etch equipped with fluorine-containing gases, such as $CF_4$, $CH_2F_2$, or $C_4F_6$ is used. In order to achieve a proper etch profile and selectivity, the anisotropic plasma etch 294 may include multiple etch portions, such as a main etch, an over etch and a post etch treatment. The dry etch 294 creates trenches 296, 298 with relatively vertical profiles, and stops at the top surface of the gate stack 266, 268 and the substrate 201. In some embodiments, one or more etch-stop layers may have been previously applied to the substrate 201 to stop or slow-down the etch process.

Figure 17:
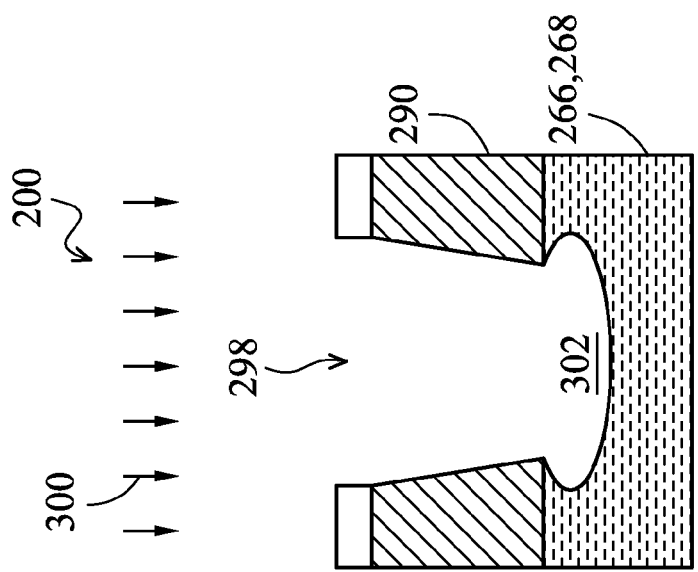

Referring to FIGS. 1 and 17, the method 100 proceeds to step 117 in which a second etch 300 is performed. In the present embodiment, a wet, isotropic etch selective to the materials of the metal gate stacks 266, 268 is used. In the embodiment above with reference to TaN, TiAl, TiN and Al, a solution such as diluted APM (NH4OH/H2O2/H2O) solution in room temperature. The wet etch 300 creates an undercut portion 302 of the trenches 298 adjacent to the gate stacks 266, 268. The wet etch 300 may further interact with the trenches 296, 298 to form a more tapered profile (see, e.g., FIG. 19). In some embodiments, the patterned PR 292 is also removed.

Figure 18:
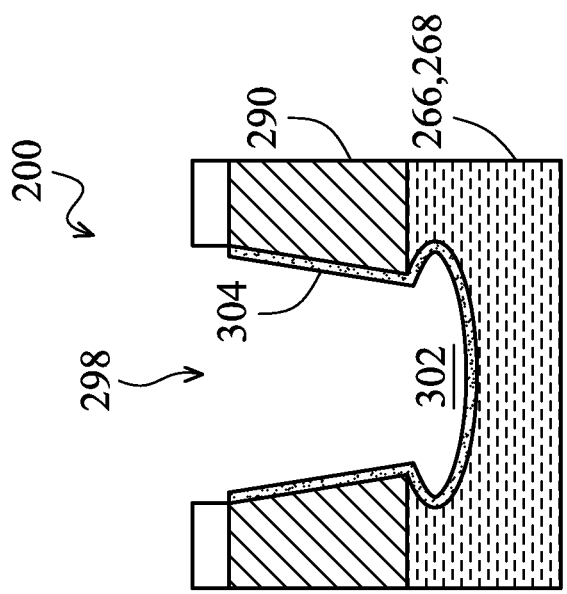

Referring to FIGS. 1 and 18, the method 100 proceeds to step 118 where a glue layer 304 is applied to the trenches 298, as well as the undercut portion 302. In the present embodiment, the glue layer 304 includes multiple deposited layers of Ti and TiN. In other embodiments, one or more additional layers can be added, such as barrier layers.

Figure 19:
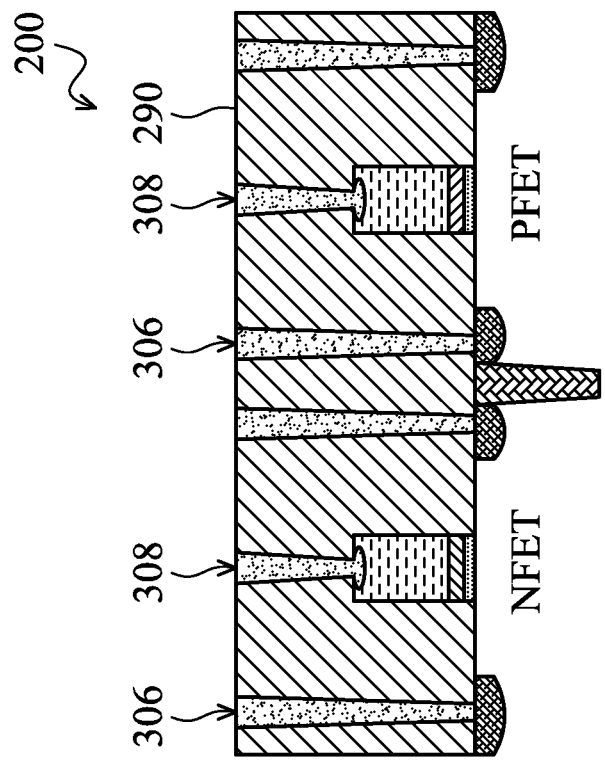

Referring to FIGS. 1 and 19, the method 100 proceeds to step 119 in which the trenches 296, 298 are filled with a contact material. In the present embodiment, the contact material is tungsten, which is deposited over the device 200. Another embodiment would include a cobalt material. A planarization process can be performed to remove portions of the contact material that is above the USG 290, resulting in S/D contacts 306 and gate contacts 308.

The present embodiments discussed above provides many benefits, it being understood that other embodiments may not have the same benefits. The benefits of the embodiments discussed above include increased surface contact between the gate contact 308 and the corresponding metal gate stacks 266, 268. By having increased surface contact, it has been found that the contact resistance there between is reduced.

The present disclosure is not limited to applications in which the semiconductor structure includes a FET (e.g. MOS transistor) and may be extended to other integrated circuit having a metal gate stack. For example, the semiconductor structures may include a dynamic random access memory (DRAM) cell, an imaging sensor, a capacitor and/or other microelectronic devices (collectively referred to herein as microelectronic devices). In another embodiment, the semiconductor structure includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit, comprising:
   a semiconductor substrate including a source region and a drain region;
   a gate dielectric over the semiconductor substrate;
   a metal gate structure over the semiconductor substrate and the gate dielectric and between the source and drain regions;
   an interlayer dielectric (ILD) over the semiconductor substrate;
   first and second contacts extending through the ILD and adjacent the source and drain regions, respectively; and
   a third contact extending through the ILD and adjacent a top surface of the metal gate structure, the third contact further extending into an undercut region of the metal gate structure.

2. The integrated circuit of claim 1, wherein the gate dielectric is a high-k dielectric.

3. The integrated circuit of claim 1, wherein the metal gate structure includes copper.

4. The integrated circuit of claim 1, wherein the third contact includes a glue layer including Ti and TiN.

5. The integrated circuit of claim 1, wherein the three contacts comprise tungsten.

6. The integrated circuit of claim 5 further comprising:
   a glue layer between the tungsten and the ILD.

7. The integrated circuit of claim 1, wherein the undercut is of a type formed by an anisotropic etch.

8. An integrated circuit, comprising:
   a substrate;
   a metal structure over the substrate, the metal structure including an undercut;
   a dielectric over the metal structure, the dielectric including a trench proximate to the undercut; and
   a contact including a conductive material in the trench and in the undercut, the contact providing electrical connection to the metal structure.

9. The integrated circuit of claim 8 further comprising:
a high-k gate dielectric between the substrate and the metal structure.

10. The integrated circuit of claim 8 wherein the metal structure is a gate structure, and includes a plurality of metal layers including copper and titanium.

11. The integrated circuit of claim 8 wherein the undercut is contained within the metal structure.

12. The integrated circuit of claim 10 further comprising:
source and drain regions in the substrate and on opposite sides of the gate structure.

13. The integrated circuit of claim 8 further comprising:
a glue layer in the undercut.

14. A integrated circuit for making an integrated circuit, comprising:
a doped substrate with a high-k dielectric;
a metal gate structure over the high-k dielectric;
an interlayer dielectric (ILD) over the metal gate structure and the doped substrate;
a trench in the ILD to a top surface of the metal gate structure;
an undercut near the top surface of the metal gate structure; and
a conductive material filling the trench and the undercut.

15. The integrated circuit of claim 14, wherein the metal gate structure includes at least one of copper or aluminum.

16. The integrated circuit of claim 9 further comprising:
a film between the metal gate structure and the ILD.

17. The integrated circuit of claim 16 wherein the film includes an oxynitride.

* * * * *